United States Patent [19]

Evain

[11] Patent Number: 4,520,931
[45] Date of Patent: Jun. 4, 1985

[54] APPARATUS FOR REORIENTING ELECTRICALLY ASYMMETRICAL AXIAL LEAD DEVICES IN A SORTER/TESTER

[75] Inventor: Jean Evain, Framingham, Mass.

[73] Assignee: Daymarc Corporation, Waltham, Mass.

[21] Appl. No.: 524,413

[22] Filed: Aug. 18, 1983

[51] Int. Cl.³ .................. B65G 47/24; B07C 5/344
[52] U.S. Cl. ........................ 209/542; 29/759; 198/381; 198/399; 209/573; 324/73 AT
[58] Field of Search .................. 209/540-542, 209/571, 573, 574, 656, 907, 572; 324/158 F, 73 AT, 73 R; 198/381, 377, 399; 29/759

[56] References Cited

U.S. PATENT DOCUMENTS

| | | | |
|---|---|---|---|
| 2,975,878 | 3/1961 | Cason | 324/158 D |
| 3,388,795 | 6/1968 | Beroset et al. | 209/573 |
| 3,702,438 | 11/1972 | Cole, Jr. | 324/158 F |
| 3,731,783 | 5/1973 | Dreher et al. | 198/398 |
| 3,810,540 | 5/1974 | Georges | 209/573 |
| 4,136,765 | 1/1979 | Abraham et al. | 198/399 |
| 4,171,051 | 10/1979 | Wullenwaber | 209/542 |

FOREIGN PATENT DOCUMENTS 48876  2/1969  Japan ................ 324/158 F

OTHER PUBLICATIONS

Product Brochure, Daymarc Corporation, Type 1620 Axial Lead Sorter, (no date).
Beroset et al., "Using Magnetic Suspension to Float Small Parts", pp. 76-81, May 1968.

Primary Examiner—Robert B. Reeves
Assistant Examiner—Donald T. Hajec
Attorney, Agent, or Firm—Kenway & Jenney

[57] ABSTRACT

An inverting apparatus for reorienting electrically asymmetrical axial lead electronic devices in a testing and sorting machine has a wheel rotatably mounted in a magnetic output bin of the tester/sorter. The bin has sets of permanent magnets mounted in its side walls that create two oppositely directed magnetic fields that define upper and lower regions of the output bin. The axis of rotation of the wheel is generally aligned with the magnetic fields across the bin. The wheel carries a set of holder assemblies each mounted for free rotation on its outer circumference. Each holder assembly carries a bar magnet that aligns the holder assembly, and a device carried in the holder assembly, with the prevailing magnetic field. As the wheel rotates the holder assemblies and the devices they carry are transported from the magnetic field in the upper region to the oppositely directed field in the lower region. The bar magnet rotates the holder assembly and the device 180° to align them with the magnetic field in the lower bin region. Preferably a fixed abutment strikes a projecting end of the bar magnet at the interface between the magnetic fields to initiate the reorientation.

11 Claims, 8 Drawing Figures

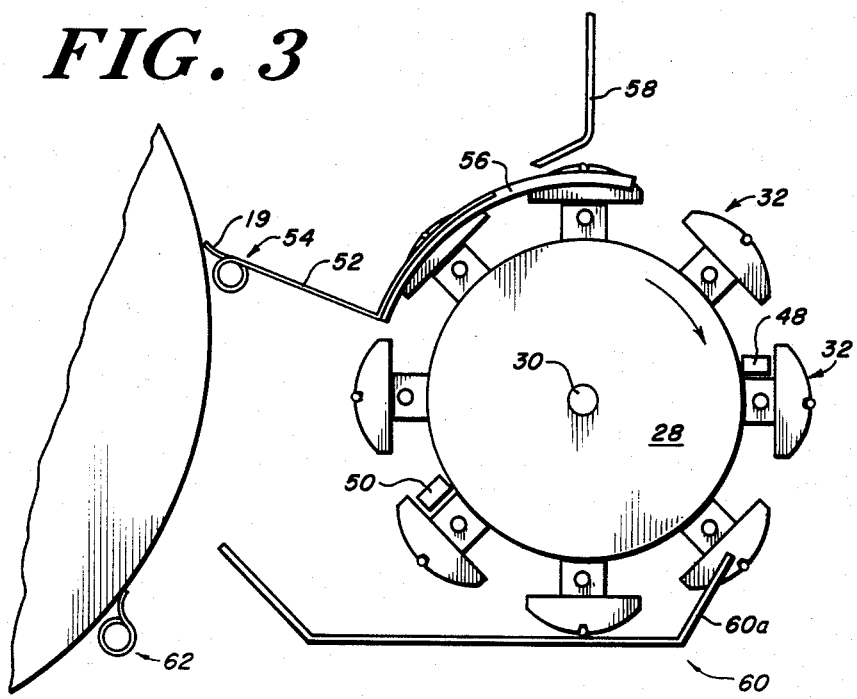
FIG. 3
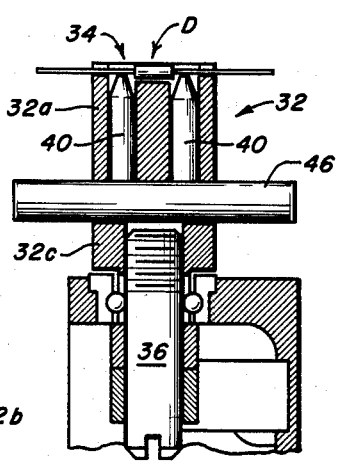
FIG. 5
FIG. 4
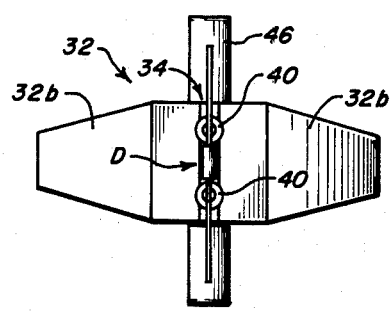
FIG. 6

APPARATUS FOR REORIENTING ELECTRICALLY ASYMMETRICAL AXIAL LEAD DEVICES IN A SORTER/TESTER

BACKGROUND OF THE INVENTION

This invention relates in general to apparatus for handling, testing and sorting electronic components. More specifically, it relates to an inverter system that reorients axial lead devices being processed by magnetic handling.

In the manufacture and use of electronic components, it is necessary to test each component reliably before it is shipped or assembled into a product. Production economics also place a high premium on the testing speed.

Certain types of electronic devices, at least for testing and handling purposes, are classified as "axial lead", that is, they have a body and two leads that extend from opposite ends of the body along generally the same axis. Resistors and diodes are common axial lead devices. The testing of diodes is complicated by the fact that they are electrically asymmetrical, that is, they present different electrical characteristics depending on which direction an electrical current flows through them. It is also significant that the leads of the devices are magnetic or paramagnetic. This allows them to be suspended horizontally in magnetic bins that have permanent magnets in their side walls, as described in Western Electric's U.S. Pat. No. 3,388,795 to Beroset et al and in the Beroset et al article "Using Magnetic Suspension to Float Small Parts" appearing at pp. 76-81 of *Automation* (May, 1968).

Testing and sorting apparatus for axial lead devices, including diodes, are known. Daymarc Corporation, the assignee of the present application, manufactures and sells a Model 1620 tester/sorter that directs the devices to a horizontal table that indexes to carry the device through a test station. Depending on the results of the tests, the devices are directed to one of several collecting bins. The processing speed of the Model 1620 tester/sorter is over 10,000 devices per hour, with a maximum rate of approximately 14,000 devices per hour.

A more recent tester/sorter, the Daymarc Model 1720, using a different handling and testing approach to achieve testing speeds in excess of 30,000 devices per hour. The devices are loaded into a conventional magnetic input bin that extends generally horizontally. It feeds a magnetic carrier wheel that picks up the devices and transports them, one by one, under a pair of "flying" test assemblies. After testing, the devices continue to rotate to one of several circumferential locations where they are stripped from the carrier wheel to either a main magnetic output bin or one of several vertically oriented collecting bins. The test result controls the strippers and therefore the location where the device is unloaded from the carrier wheel. Most of the devices, usually those that test out as being satisfactory and have the same preselected electrical orientation, are directed to the main output bin, which also extends generally horizontally and is generally aligned with the input bin. The movement or "flow" of devices through the tester/sorter is therefore generally horizontal.

One difficulty with the Model 1720 tester/sorter, and other horizontal flow test using magnetic handling apparatus known in the prior art, is that they do not have the capability to orient electrically asymmetrical devices reliably and quickly so that they all have the same electrical orientation. One solution is to pre-test the devices before they are loaded into the tester/sorter and then orient them uniformly. Western Electric's U.S. Pat. No. 3,731,783 to Dreher et al. describes a device that performs this task. It has two output bins, one for each of the two possible orientations of the devices. This solution has not proven to be practical, however, since it requires an additional steps—the pre-sort and then a combining of the devices from the two collecting bins. Another solution is to collect devices with different orientations in different bins. The difficulty here is that this requires two collecting bins for each sorting category. Because there are usually more than a few sorting categories, the result is that an unacceptably large total number of bins may be required.

Western Electric's U.S. Pat. No. 4,136,765 to Abraham et al. describes one attempt to improve on the Dreher et al. arrangement. Devices with one orientation are collected in an upper bin and then fed to a mechanical and magnetic spiral path that carries each device through a 180° rotation as it descends to the lower collecting bin under the influence of gravity and air jets. The result is that all of the devices are collected in one bin, the lower bin, and they have the same electrical orientation. While this arrangement would appear to solve the "re-orientation problem," it has not proved to be commercially practical. One problem is that the spiral track is susceptible to jams, particularly where the leads are misaligned or bent.

While other types of testing apparatus, primarily ones using a vertical feed path, are known, the reorienting task is performed by arrangements that are tailored to the vertical mode of movement of the devices through the apparatus. U.S. Pat. No. 2,975,878 is exemplary of such a mechanical reorienting system and U.S. Pat. No. 3,702,438 is exemplary of a mechanical/magnetic system. In general, reorienting arrangements using gravity where the device is not under a continuous positive control have proven to have reliability problems. Heretofore, no reorienting apparatus has been able to operate as an integral component of a horizontal flow tester/sorter using magnetic handling, where the devices have a random orientation on input and a uniform orientation in a single output bin.

It is therefore a principal object of the present invention to provide an inverting system for a horizontal flow radial lead tester/sorter using magnetic handling where the inverter system operates rapidly and with a high degree of reliability.

Another principal object is to provide such an inverter system that operates in conjunction with a single main output bin so that all of the devices collected in the bin have the same electrical orientation.

A further object is to provide an inverter system with the foregoing advantages that is readily compatible with the Model 1720 tester/sorter manufactured and sold by Daymarc Corporation.

Another object is to provide an inverter system with the foregoing advantages that is not sensitive to misaligned or bent leads or to devices having varying masses or dimensions.

Yet another object is to provide an inverter system where the device being inverted is under a continuous positive control during the inversion.

A still further object is to provide an inverter system with all of the foregoing advantages that has a relatively uncomplicated construction and a favorable cost of manufacture.

SUMMARY OF THE INVENTION

In a high speed, horizontal flow machine for testing and sorting electrically asymmetrical axial lead electronic devices, an inverting system located in a main magnetic output bin of the tester/sorter reorients certain of the devices by rotating them 180°. The devices are carried on a rotating carrier wheel of the tester/sorter through a test station. Depending on the results of the test, which determines among other things the electrical orientation of the device, one of several strippers is activated to remove the device from the carier wheel at a preselected circumferential location. Strippers are located adjacent upper and lower portions of the output bin.

The inverting system of the present invention utilizes oppositely directed magnetic fields generated, in the preferred form, by permanent magnets located in the side walls of the output bin. The upper and lower portions of the bin are defined by these oppositely directed fields. The inverting system also utilizes an inverting wheel mounted within the output bin near the main carrier wheel. The inverting wheel preferably rotates about an axis of rotation that is generally aligned with the magnetic fields in the bin. The outer edge of the inverting wheel carries a set of holder assemblies that each magnetically secure one device in a slot formed at the outer surface of the holder assembly. An inverting bar magnet is mounted on each holder assembly with its magnetic poles aligned with the slot. The holder assemblies are mounted for free rotation and therefore each holder moves under the influence of the associated inverting magnet to align itself with the prevailing magnetic field within the bin.

In operation, devices having a desired electrical orientation are stripped from the main carrier wheel into lower bin region. Devices having the opposite orientation are stripped in the upper bin region and guided to the inverting wheel where they are picked off, one at a time, by the holder assemblies. In the preferred form, guide plates assist the movement of the devices to the wheel and an air jet ensures that only one device is carried on each holder. Rotation of the inverter wheel carries the holders and the devices held in the holders to and through a transition zone between the oppositely directed magnetic fields. In the preferred form, the inverting magnet strikes a fixed abutment surface which initiates a rotation of the holder assembly and its device as it passes through the transition zone. As the wheel continues to rotate into the lower bin region, the inverting magnet continues the rotation begun by the abutment surface until the inverting magnet, holder assembly and device are rotated 180° into alignment with the magnetic field prevailing in the lower bin region. A stripper mounted in the output bin removes the inverted or reoriented device from its holder to deposit it in the lower region of the main output bin. Preferably a second abutment surface initiates the reversal of the holder assemblies to their initial position as they are carried from the lower bin region to the upper bin region where they pick up another device.

These and other features and objects of the present invention will be more fully understood from the following detailed description which should be read in light of the accompanying drawings.

BRIEF DESCRIPTION OF THE DRAWINGS

FIG. 3 is a detailed view in side elevation of the inverting wheel shown in FIG. 2 and related assemblies;

FIG. 4 is a view in vertical section and partially in side elevation of the inverting wheel and related assemblies shown in FIGS. 2 and 3;

FIG. 5 is a detailed view in vertical section and partially in side elevation of the holder assemblies shown in FIGS. 3 and 4;

FIG. 6 is a top plan view of the holder assembly shown in FIG. 4;

DETAILED DESCRIPTION OF THE PREFERRED EMBODIMENTS

Figure 1:
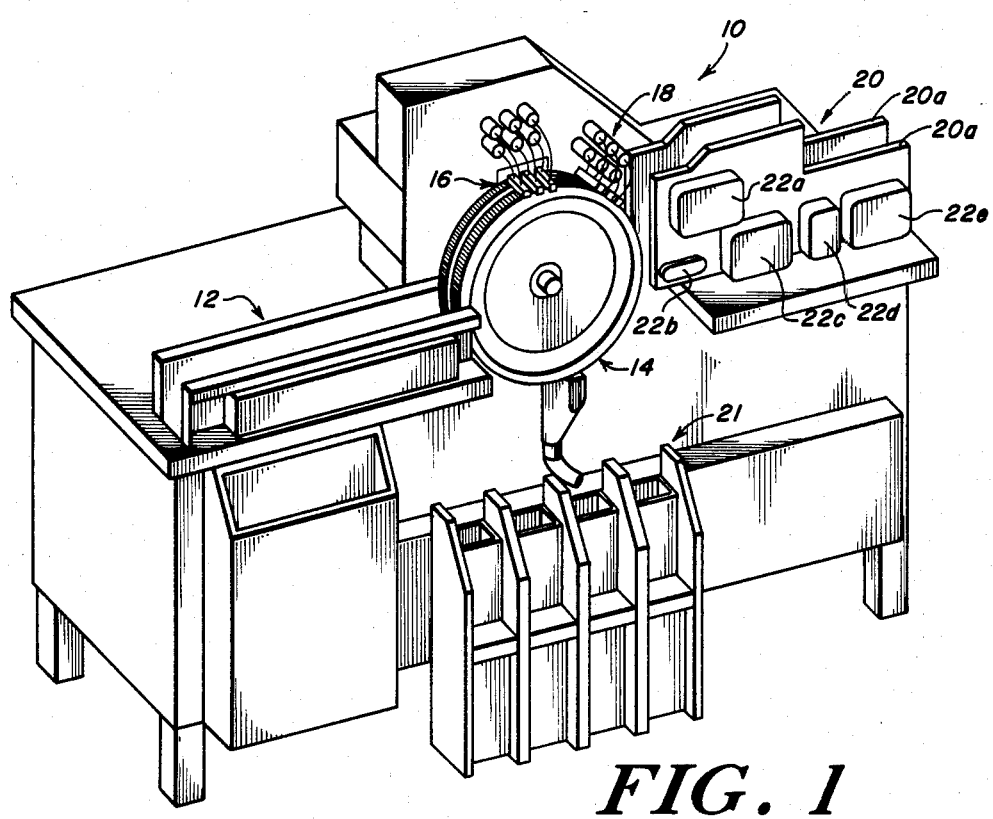
FIG. 1 is a view in perspective of a high-speed, horizontal-flow testing and sorting apparatus for axial lead devices.
Figure 8:
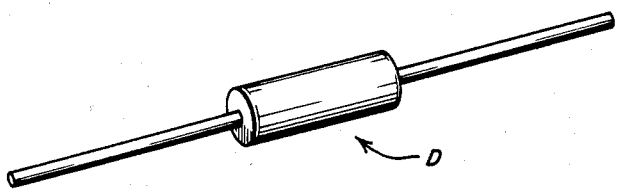
FIG. 8 is a view in perspective of a typical axial lead device.

With reference to FIG. 1, a high-speed, axial lead testing and sorting apparatus 10 includes an input bin 12 that holds a supply of axial lead devices such as diodes D. A typical diode D is shown in FIG. 8, although the leads are usually longer and thinner than shown. The bin 12 may for example be a conventional magnetic bin which aligns the devices transversely within the bin 12 and propels them horizontally towards a rotatable carrier wheel 14. The wheel 14 is also of known construction and includes magnets or a vacuum arrangement to attract the devices from the input bin and hold them in a circumferentially spaced array on the periphery of the wheel 14. Each device is oriented generally parallel to the axis of rotation of the wheel. The wheel 14 rotates at a constant velocity in a clockwise direction (as shown).

As the axial lead devices move on the periphery of the wheel 14 from the input bin 12, they pass under a first contactor assembly 16 and a second contactor assembly 18. These assemblies 16 and 18 establish electrical connection between the axial lead devices and a test circuit (not shown) of suitable design. This connection is made as the devices move continuously on the carrier wheel 14 through a "test zone" associated with each of the contactor assemblies 16 and 18. After the axial lead devices have been tested, strippers 19, operating in response to the results of the test, strip the devices from the carrier wheel 14 and load them into either a main magnetic output bin 20 that extends generally horizontally in alignment with the input bin 12 or one of a set of vertically oriented holding bins 21. The "flow" of devices through the apparatus 10 is generally horizontal and, as shown, from left to right. The bin 20 is shown with its magnets visible. The magnets can, of course, be enclosed in the side walls of the bin.

Figure 2:
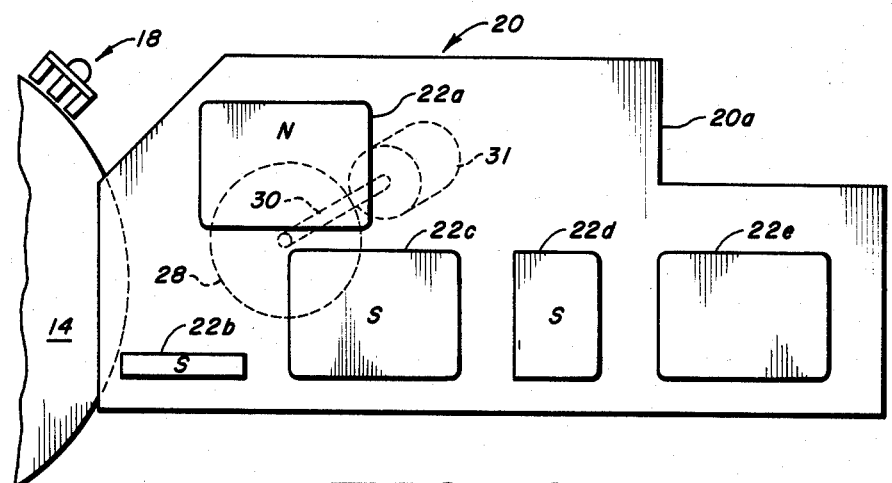
FIG. 2 is a simplified schematic view in side elevation of the magnetic output bin and a portion of the main carrier wheel shown in FIG. 1 where the output bin includes an inverting system according to the present invention.
Figure 7:
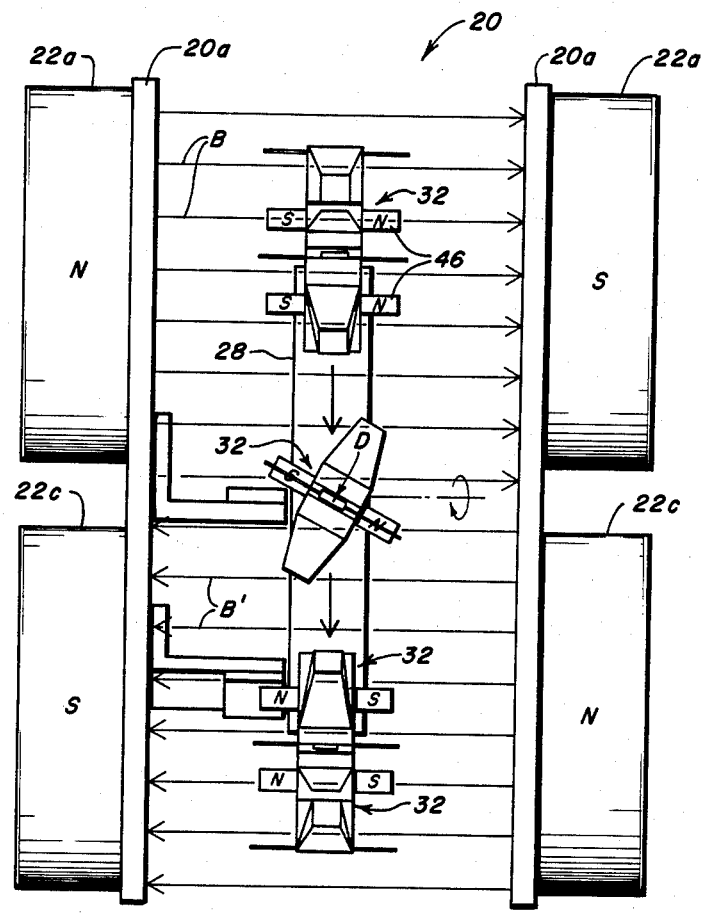
FIG. 7 is an end view in elevation (with guides and strippers omitted) of the output bin shown in FIGS. 1 and 2 looking towards the main carrier wheel.

With reference to FIGS. 2, 3 and 7, the output bin 20 has a group of permanent magnets 22a, 22b, 22c, 22d, and 22e mounted in each of its side walls 20a (only the "outboard", or front, wall is shown in FIG. 2). The magnet 22a in outboard wall 20a has its north pole facing outwardly and a south pole face adjacent the devices held in the bin 20. An identical magnet 22a (not shown) is mounted in the same location in the "inboard" wall 20a with its north pole face adjacent the devices held in the bin 20. This magnet pair produces a strong magnetic field with lines B of magnetic induction (FIG. 7) directed generally horizontally across the bin 20 and aligned with the axis of rotation of the carrier wheel 14 and the devices held in the apparatus 10. The magnets 22b, 22c, 22d, and 22e also have a "mating" magnet located in the same position in the inboard wall 20a. The pole faces of the magnets 22b . . . 22e adjacent the bin 20 have an opposite polarity from that of the comparable pole face of the magnet 22a in the same wall. The magnets 22b, 22c, 22d, and 22e also create a strong magnetic field with the lines B' of magnetic induction directed generally horizontally across the bin 20. However, because the magnet 22a in each wall 20a is of opposite polarity from the magnets 22b–22e, the bin 20 has an upper region 24 where the lines B of magnetic induction run in one direction, and a lower region 26 where the lines B' (FIG. 7) of magnetic induction run in the opposite direction. The dashed line 28 in FIG. 2 denotes a transition zone where the direction of the prevailing magnetic field switches 180°. The transition zone is generally horizontal in the region of the magnets 22a, 22a and forms a boundary between the upper and lower bin regions 24 and 26.

The magnets 22a, 22b, 22c, 22d, and 22e are each sufficiently strong to suspend an axial lead device within the bin with its leads generally aligned with the prevailing magnetic field as described gnerally, for example, in the aforementioned U.S. Pat. No. 3,388,795. The magnets also produce a magnetic field of varying strength as one proceeds horizontally along the bin 20 to provide a magnetic flux gradient in the bin that tends to propel devices suspended in the bin in a left-to-right direction (as shown).

In addition to the bi-directional magnetic field within the bin 20, another principal feature of the present invention is an inverter wheel 28 mounted within the bin 20 near the carrier wheel 14. The wheel 28 rotates about and is replaceably secured on a shaft 30 that is generally aligned with the axis of rotation of the carrier wheel 14 and the lines of magnetic induction within the bin 20. A motor 31 drives the shaft 30 at a rotational speed that accommodates the operating speed of the test apparatus 10.

Multiple holder assemblies 32 are mounted on the outer circumference of the wheel 28. The assemblies 32 have a head portion 32a with a curved outer surface 32b that is generally concentric with the wheel 28. A slot 34 formed in the outer surface 32b of each holder is sized to receive one of the devices in a close-fitting relationship to ensure that only one device is carried by one assembly 32. A hub 32c of the holder assembly is formed integrally with the head assembly 32a and secured on the end of a shaft 36 that is mounted for free rotation with respect to the wheel 28 in a ball-bearing mount 38 or an equivalent structure. The head portion 38a mounts a pair of small magnets 40,40 that attract and secure the device in the slot 34. At the interior of the wheel 28, an arm 42 is secured to the lower end of the shaft 36 with its end positioned to strike a mass 44 of a resilient material. The arm and the resilient mass are positioned to damp oscillations of the assembly 32 after it has rotated to a positon where the slot 34 and the device held in that slot are aligned with the prevailing magnetic field in the bin.

A bar magnet 46 mounted in the assembly 32 has north and south pole end portions that project from the hub 32c. The magnet 46 is sufficiently strong that it will overcome frictional forces in the mount for the head assembly 32 to rotate it into alignment with the magnetic field in the bin 20. The magnet 46 "follows" the change in direction of the magnetic field present in the bin to reverse the orientation of the holder assembly 32 and the device it holds. The bar magnet is generally aligned with the slot 34 so that the device will have the same orientation as the bar magnet.

A fixed abutment surface 48 mounted on a wall of the bin 20 extends into the path of travel of the holder assemblies so that one end of the magnet 46 will strike the abutment surface. The abutment surface, or "kicker," is located just "before" the transition zone (with a clockwise rotation of the wheel 28, as shown). The kicker 48 therefore initiates the 180° rotation of the assembly 32 the moment it enters the "oppositely" directed magnetic field of the lower bin region as shown in FIG. 7. A like abutment surface or "kicker" 50 is located before the transition zone as the assembly 32 is carried by the wheel 28 back to the upper bin region.

In its preferred form, as illustrated in FIG. 3, the inverter system of the present invention includes a guide plate 52 that directs devices stripped from the carrier wheel 14 at an upper position 54 associated with one of the strippers 19 to the outer surface 32b of the holder assemblies 32. A pair of guide plates 56 cooperate with the guide plate 52. The plates 56 straddle the head portions 32a as they rotate upwardly in the upper bin region. The plates 56 have a circular curvature corresponding to the path of motion of the head portions 32a, but they are "set back" so that the slot 34 and a device carried in the slot project above the outer surface of the plates 56,56. This arrangement not only guides the devices, but also acts as an accumulator for the devices and assists in ensuring that only one device is carried in each slot. If more than one device should become attracted to the holder assembly, or more specifically to its magnets 40,40, then an air jet from a tube 58 dislodges any devices not seated in the slot 34. Dislodged devices are driven down the guide plates 56,56 so that they are available to be picked up by a following holder assembly 32.

The system also preferably has a lower guide plate and stripper 60 located in the lower bin region at a point where the reorientation of the holder assemblies is complete. Inclined cam surfaces 60a,60a project upwardly along the sides of the wheel 28 to engage the laterally projecting leads of devices carried on the wheel 28 in the holder assemblies 32. The inclination of the surfaces 60a,60a is such that the leads initially are positioned above the surface, but continued rotation of the wheel 28 carries them to a position where they engage the surfaces 60a,60a and are lifted from the holder assemblies. The stripped device is then suspended in the lower bin region with devices stripped from the wheel 28 by one of the strippers 19 at a location 62 (FIG. 3). The guide plate 60 also serves to restrain devic,es of one selected electrical orientation to the lower bin region.

In operation, the motor 31 rotates the wheel 28 continuously at a uniform velocity that is sufficient to remove from the upper bin region above the guide plate 52 all of the devices removed at the location 54 (those having one electrical orientation). The stripper at the location 62 removes to the lower bin region those devices which tested satisfactorily and have the opposite electrical orientation. As a given holder assembly 32 moves upwardly under the guide plates 56, it picks up one device from the upper bin region. It then transports it along a circular path to the transition zone where the kicker 48 initiates the reorientation of the holder assembly and therefore the device it carries. The reversal of the direction of the magnetic fields as the holder assembly continues its rotation into the lower bin region completes and maintains the reversal. Further rotation strips the reoriented device, as discussed above. The empty holder assembly then continues along its circular, closed-loop path of motion until it returns to pick up another device in the upper bin region to repeat the process.

The inverter system described above has proven to be highly reliable and compatible with even the quite high operating speed of the Daymarc Model 1720 tester/sorter mentioned above. This system is also compatible with the design and mode of operation of the Model 1720. It has also proven to be relatively insensitive to misaligned or bent leads.

While the invention has been described with respect to its preferred embodiment, various modifications and alterations will occur to those skilled in the art from the foregoing detailed description and the accompanying drawings. For example, while an inverter wheel has been described as carrying the devices through a magnetic field reversal, other transporting mechanisms such as conveyors will occur to those skilled in the art. Also, other types of holder constructions for the devices can be used. One example is a holder utilizing a vacuum system to secure the devices during the transport. These and other modifications and variations are intended to fall within the scope of the appended claims.

What is claimed is:

1. Orienting apparatus for use in conjunction with apparatus that tests and sorts electrically asymmetrical, axial lead electronic devices, said test/sort apparatus having a magnetic input bin, a magnetic output bin, an intermediate magnetic carrier wheel, means for electronically testing each of the devices as they are carried on the outer circumference of said wheel, and means for stripping said devices from said wheel after said testing at one of several preselected circumferential locations in response to the results of said test, said devices being aligned generally in the same physical orientation while in said test/sort apparatus, but having a random electrical orientation in said input bin and on said carrier wheel, said orienting apparatus comprising means for creating a bi-directional magnetic field in said magnetic output bin to produce an upper bin region and a lower bin region with oppositely directed magnetic fields, a first one of said stripper means operating to direct devices to said upper bin region and a second one of said stripper means operating to direct said devices to said lower bin region, means mounted in said output bin for transporting said devices in said upper bin region to said lower bin region, said transporting means including a plurality of means for holding one of said devices, said holding means being mounted on said transporting means for free rotation through at least 180° between positions where the devices are aligned with said magnetic fields, orientation magnet means mounted on each of said holding means to align said holding means and the device carried on the associated holder with said magnetic fields, said orientation magnet means reversing the alignment of the associated one of said holding means as said transporting means carries it from one of said bin regions to the other and through a zone where the bi-directional magnetic field is reversed.

2. The orienting apparatus of claim 1 further comprising mechanical means for ensuring that said reversing is initiated in the zone where said magnetic field reversal occurs.

3. The orienting apparatus of claim 2 wherein said orientation magnet means is a bar magnet having at least one end that projects from said holder means and wherein said mechanical reversal initiation means comprises stop means positioned to intercept said at least one end in said magnetic field reversal zone.

4. The orienting apparatus of claim 1 wherein said transporting means comprises a wheel mounted for rotation in said output bin about an axis of rotation that is generally aligned with the magnetic fields within said output bin.

5. The orienting apparatus of claim 4 wherein said wheel extends into both said upper and lower bin regions and further comprising means for rotating said wheel.

6. The orienting apparatus of claim 4 wherein said plurality of holding means comprises a set of holder assemblies equiangularly spaced about the circumference of said wheel and each including a mounting shaft mounted for free rotation in said wheel and a carrier head secured on said shaft and having an open slot formed in its outwardly facing surface to receive one of said devices.

7. The orienting apparatus of claim 6 wherein said carrier head mounts said orientation magnet means and also mounts at least one holding magnet located near said slot and adapted to secure said device in the slot.

8. The orienting apparatus of claims 1, 4 or 6 further comprising means for removing devices from said transporting means in said lower bin region.

9. The orienting apparatus of claim 3 wherein said transporting means operates in a closed loop travel path and wherein at least one of said stop means is located adjacent said reversal zone.

10. The orienting apparatus of claim 1 further comprising means for ensuring that only one of said devices is carried on one of said holding means.

11. The orienting apparatus of claim 1 wherein said bi-directional magnetic field creation means comprises a set of permanent magnets of opposite polarity mounted on said output bin.

* * * * *